United States Patent
Sakakura et al.

(10) Patent No.: US 7,511,502 B2
(45) Date of Patent: Mar. 31, 2009

(54) MAGNETIC RESONANCE IMAGING APPARATUS

(75) Inventors: Yoshitomo Sakakura, Nasushiobara (JP); Masatoshi Hanawa, Otawara (JP)

(73) Assignees: Kabushiki Kaisha Toshiba, Tokyo (JP); Toshiba Medical Systems Corporation, Tochigi (JP)

( * ) Notice: Subject to any disclaimer, the term of this patent is extended or adjusted under 35 U.S.C. 154(b) by 0 days.

(21) Appl. No.: 11/958,925

(22) Filed: Dec. 18, 2007

(65) Prior Publication Data

US 2008/0164876 A1 Jul. 10, 2008

(30) Foreign Application Priority Data

Jan. 5, 2007 (JP) .............................. 2007-000699
Nov. 13, 2007 (JP) .............................. 2007-294565

(51) Int. Cl.
*G01V 3/00* (2006.01)

(52) U.S. Cl. ...................................... 324/318; 324/319

(58) Field of Classification Search ......... 324/300–322; 600/407–422

See application file for complete search history.

(56) References Cited

U.S. PATENT DOCUMENTS

| 5,786,695 | A | * | 7/1998 | Amor et al. ................. 324/320 |
| 5,793,209 | A | * | 8/1998 | Kondo et al. ................ 324/318 |
| 6,163,240 | A | * | 12/2000 | Zuk et al. .................... 335/299 |
| 6,538,440 | B2 | | 3/2003 | Dean et al. |
| 6,600,401 | B2 | * | 7/2003 | Zuk et al. .................... 335/299 |
| 6,845,262 | B2 | * | 1/2005 | Albert et al. ................ 600/420 |
| 6,977,501 | B2 | * | 12/2005 | Kassai et al. ................ 324/315 |

FOREIGN PATENT DOCUMENTS

JP 8-196518 8/1996

* cited by examiner

*Primary Examiner*—Brij B Shrivastav
(74) *Attorney, Agent, or Firm*—Nixon & Vanderhye PC

(57) ABSTRACT

A magnetic resonance imaging apparatus includes a static magnetic field magnet which generates a static magnetic field, a gradient coil unit which generates a gradient magnetic field for overlapping with the static magnetic field, a shim unit which is disposed between the static magnetic field magnet and the gradient coil unit to control the static magnetic field, and a heat shielding member which is disposed between the gradient coil unit and the shim unit to shield a radiant heat of the gradient coil unit.

13 Claims, 4 Drawing Sheets

MAGNETIC RESONANCE IMAGING APPARATUS

CROSS-REFERENCE TO RELATED APPLICATIONS

This application is based upon and claims the benefit of priority from prior Japanese Patent Applications No. 2007-000699, filed Jan. 5, 2007; and No. 2007-294565, filed Nov. 13, 2007, the entire contents of both of/all of which are incorporated herein by reference.

BACKGROUND OF THE INVENTION

1. Field of the Invention

The present invention relates to a magnetic resonance imaging (MRI) apparatus with a gradient coil for generating a gradient magnetic field upon energizing the gradient coil.

2. Description of the Related Art

In a general MRI apparatus, a cylindrical bobbin is disposed between a space through which a subject enters and a gradient coil. In terms of the bobbin, the subject is prevented from directly contacting with the gradient coil (for example, see JP-A-8-196518).

However, in a recent MRI apparatus, current flowing into the gradient coil tends to increase. As a result, a radiant heat that is generated from the gradient coil upon energizing the gradient coil increases. For this reason, a problem arises in that the bobbin is heated by the radiant heat so that a temperature of the bobbin becomes high, and thus the subject may feel uncomfortable.

Particularly, in the recent MIR apparatus, it is demanded that an opening through which the subject enters is enlarged in order to improve an amenity of the subject. For realizing the demand, a spacing distance between the gradient coil and the bobbin necessarily decreases, and thus the radiant heat of the gradient coil makes easily the temperature of the bobbin high.

Further, in the MRI apparatus, an iron shim for controlling uniformity of static magnetic field may be disposed between a static magnetic field magnet and the gradient coil. When the iron shim is heated by the radiant heat of the gradient coil, a problem arises in that an influence of the iron shim with respect to the static magnetic field varies, and thus the uniformity of a static magnetic field may vary.

BRIEF SUMMARY OF THE INVENTION

Because of the above-described problems, an apparatus for preventing the radiant heat of the gradient coil from being transmitted to a portion to be affected by the radiant heat has been demanded.

According to a first aspect of the invention, there is provided a magnetic resonance imaging apparatus including a static magnetic field magnet which generates a static magnetic field; a gradient coil unit which generates a gradient magnetic field for overlapping with the static magnetic field; a shim unit which is disposed between the static magnetic field magnet and the gradient coil unit to control the static magnetic field; and a heat shielding member which is disposed between the gradient coil unit and the shim unit to shield a radiant heat of the gradient coil unit.

According to a second aspect of the invention, there is provided a magnetic resonance imaging apparatus including a static magnetic field magnet which generates a static magnetic field; a gradient coil unit which generates a gradient magnetic field for overlapping with the static magnetic field; a transmission coil which transmits a high-frequency pulse; and a heat shielding member which is disposed between the gradient coil unit and the transmission coil to shield a radiant heat of the gradient coil unit and to shield the high-frequency pulse.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Hereinafter, an exemplary embodiment of the invention will be described with reference to the accompanying drawings.

Figure 1:
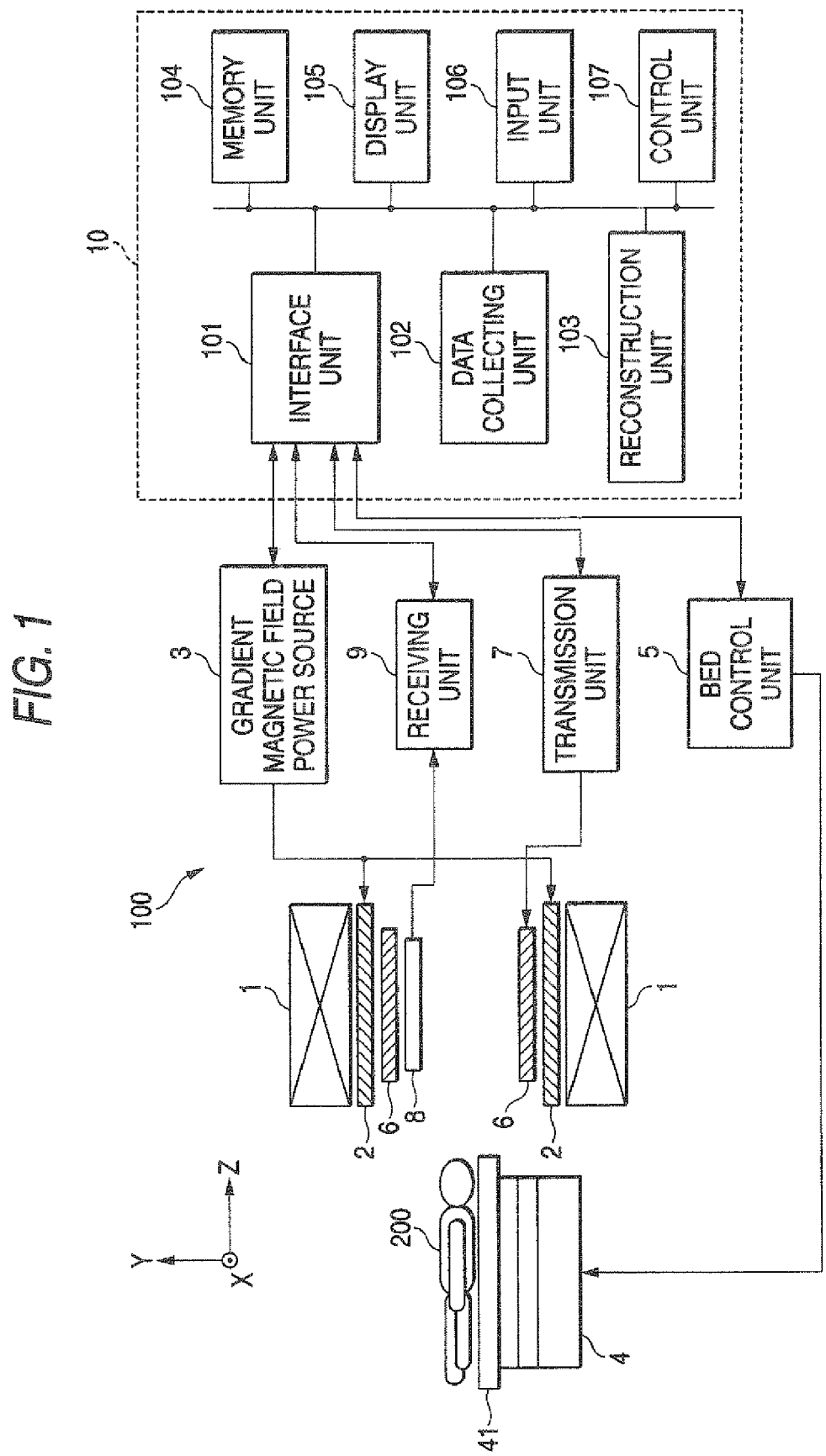
FIG. 1 is a view illustrating a configuration of a magnetic resonance imaging apparatus (MRI apparatus) according to an exemplary embodiment of the invention.

FIG. 1 is a view illustrating a configuration of a magnetic resonance imaging apparatus (MRI apparatus) 100 according to the embodiment of the invention. The MRI apparatus 100 includes a static magnetic field magnet 1, a gradient coil unit 2, a gradient magnetic field power source 3, a bed 4, a bed control unit 5, a body coil 6, a transmission unit 7, a receiving coil 8, a receiving unit 9, and a computer system 10.

The static magnetic field magnet 1 is formed in a cylindrical shape with a hollow, and generates a uniform static magnetic field in an inside space thereof. As the static magnetic field magnet 1, for example, a permanent magnet, a superconductive magnet, or the like is used.

The gradient coil unit 2 is formed in a cylindrical shape with a hollow, and disposed inside the static magnetic field magnet 1. In the gradient coil unit 2, three types of coils corresponding to X, Y, and Z axes which intersect each other are combined. The gradient coil unit 2 generates a gradient magnetic field of which a magnitude is gradient along the X, Y, and Z axes when the gradient magnetic field power source 3 individually supplies current to each of the three types of coils. Additionally, the direction Z, for example, is set to the same direction as that of the static magnetic field. The gradient magnetic fields in the X, Y, and Z axes, for example, correspond to a slice selection gradient magnetic field Gs, a phase encoding gradient magnetic field Ge, and a read-out gradient magnetic field Gr, respectively. The slice selection gradient magnetic field Gs is used to arbitrarily determine an imaging section. The phase encoding gradient magnetic field Ge is used to encode a phase of a magnetic resonance signal in accordance with a location in space. The read-out gradient magnetic field Gr is used to encode a frequency of the magnetic resonance signal in accordance with the location in space.

A subject 200 is allowed to enter the hollow (imaging hole) of the gradient coil unit 2 while being placed on a top plate 41 of the bed 4. The bed 4 is driven by the bed control unit 5 so that the bed 4 moves in the longitudinal direction and the vertical direction. In general, the bed 4 is installed so that a central axis of the static magnetic field magnet 1 is in parallel to the longitudinal direction.

The body coil (transmission RF coil) 6 is disposed inside the gradient coil unit 2. The body coil 6 generates a high-frequency magnetic field when being supplied with a high-frequency pulse from the transmission unit 7.

The transmission unit 7 transmits a high-frequency pulse corresponding to a Larmor frequency to the body coil 6.

The receiving coil 8 is disposed inside the gradient coil unit 2. The receiving coil 8 receives a magnetic resonance signal radiated from the subject influenced by the high-frequency magnetic field. An output signal from the receiving coil 8 is input to the receiving unit 9.

The receiving unit 9 creates magnetic resonance signal data on the basis of the output signal from the receiving coil 8.

The computer system 10 includes an interface unit 101, a data collecting unit 102, a reconstruction unit 103, a memory unit 104, a display unit 105, an input unit 106, and a control unit 107.

The interface unit 101 is connected to the gradient magnetic field power source 3, the bed control unit 5, the transmission unit 7, the receiving coil 8, the receiving unit 9, etc. The interface unit 101 inputs and outputs signals which are transmitted and received between the connected units and the computer system 10.

The data collecting unit 102 collects a digital signal output from the receiving unit 9 through the interface unit 101. The data collecting unit 102 stores the collected digital signal, that is, magnetic resonance signal data in the memory unit 104.

The reconstruction unit 103 performs a reconstruction such as a post process, that is, a Fourier transform on the magnetic resonance signal data stored in the memory unit 104, so that spectrum data or image data of a desired nuclear spin in the subject 200 is obtained.

The memory unit 104 stores the magnetic resonance signal data, and the spectrum data or the image data of each patient.

The display unit 105 displays various information such as the spectrum data or the image data under a control of the control unit 107. As the display unit 105, a display device such as a liquid crystal display device may be used.

The input unit 106 receives various instructions or information input from an operator. As the input unit 106, a pointing device such as a mouse or a track ball, a selection device such as a mode switch, or an input device such as a keyboard may be appropriately used.

The control unit 107 includes a CPU, a memory, and the like which are not shown in the drawing, and generally controls each unit of the MRI apparatus 100 so as to realize general functions provided in a known MRI apparatus.

Figure 2:
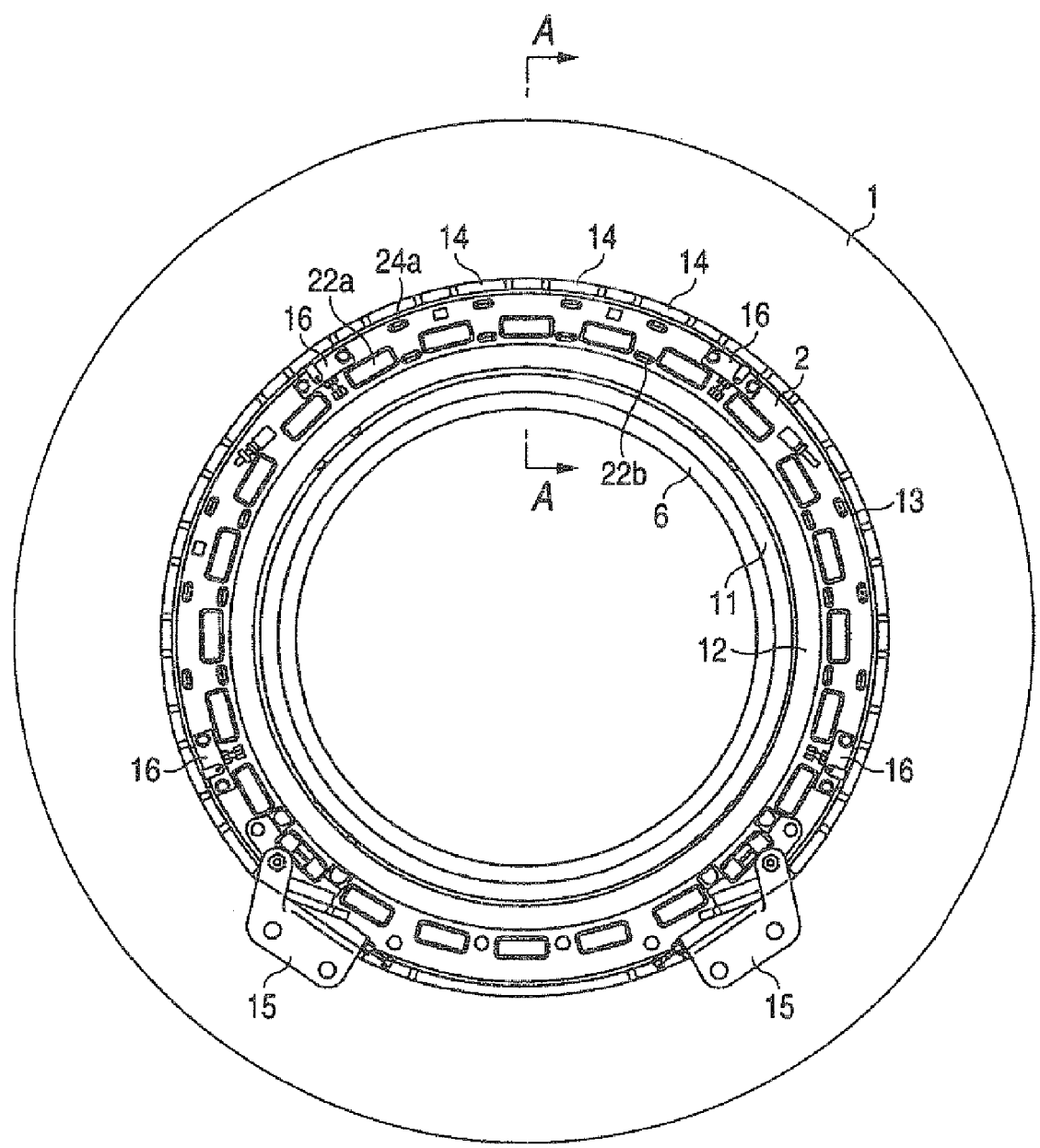
FIG. 2 is a top view specifically illustrating a configuration in the periphery of a gradient coil unit 2 when viewed in a Z direction shown in FIG. 1.
Figure 3:
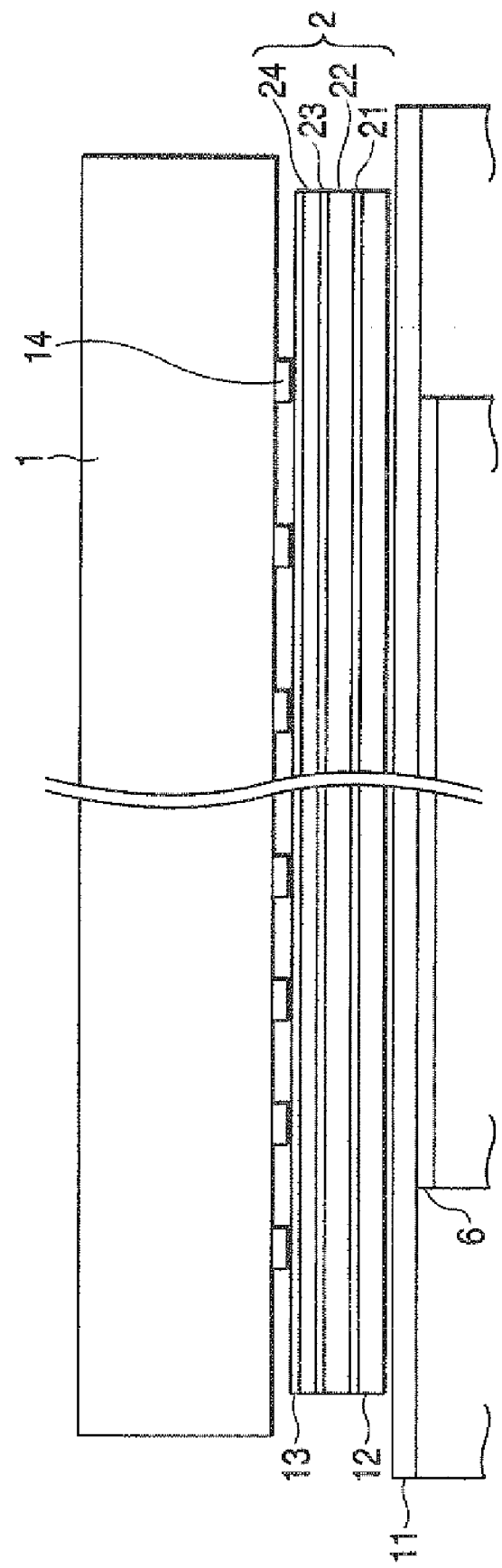
FIG. 3 is a sectional view taken along the arrow A-A shown in FIG. 2.

FIGS. 2 and 3 are views specifically illustrating a configuration in the periphery of the gradient coil unit 2. FIG. 2 is a top view when viewed in the Z direction. FIG. 3 is a sectional view taken along the arrow A-A shown in FIG. 2. Additionally, in FIG. 3, the internal configuration of each unit is not shown, but only the outline of the section is shown. A part of components shown in FIGS. 2 and 3 are omitted in FIG. 1. Further, in FIGS. 2 and 3, each thickness of a part of components is exaggeratingly shown, but the thickness ratio of each component is different from the actual thickness ratio.

The gradient coil unit 2 is a so-called actively shielded gradient coil (ASGC). As shown in FIG. 3, the gradient coil unit 2 has a structure in which a main coil layer 21, a shim layer 22, a shield layer 23, and a cooling layer 24 are sequentially laminated from the inner peripheral side.

The main coil layer 21 is formed such that the three types of coils (X-main coil, Y-main coil, and Z-main coil) corresponding to the X, Y, and Z axes, respectively, are formed in a cylindrical shape by a resin molding.

The shim layer 22 is formed such that a plurality of shim pockets 22a and a plurality of cooling pipes 22b which are arranged along the Z axis as shown in FIG. 2 are formed in a cylindrical shape by a resin molding. Each of the shim pockets 22a is a narrow and long space along the X axis, and an iron shim (not shown) is appropriately disposed therein. A coolant flows into the cooling pipes 22b to cool the gradient coil unit 2.

The shield layer 23 is formed such that three types of shield coils (X-shield coil, Y-shield coil, and Z-shield coil) which are supplied with current from the gradient magnetic field power source 3 and which generate a magnetic field for shielding a magnetic field leaking from the main coil layer 21 are formed in a cylindrical shape by a resin molding.

The cooling layer 24 is formed such that a plurality of cooling pipes 24a which are arranged along the Z axis as shown in FIG. 2 are formed in a cylindrical shape by a resin molding. A coolant flows into the cooling pipes 24a to cool the gradient coil unit 2.

Additionally, each layer of the gradient coil unit 2 may be formed individually or may be formed integrally by a resin molding.

The gradient coil unit 2 is supported by two support units 15 which are attached to both side ends of the static magnetic field magnet 1, respectively. A space is formed between the gradient coil unit 2 and the static magnetic field magnet 1 by the support units 15 and four control units 16 which are attached to both the side ends of the gradient coil unit 2, respectively. In this space, the iron shim 14 is appropriately disposed so as to be attached to the static magnetic field magnet 1.

Inside the gradient coil unit 2, a cylindrical bobbin 11 is disposed so as to form a space between the inner surface of the gradient coil unit 2 and the bobbin 11. The bobbin 11, for example, is formed of glass epoxy resin. The body coil 6 is attached to the inner surface of the bobbin 11.

The gradient coil unit 2 is disposed in a space formed between the inner surface of the static magnetic field magnet 1 and the outer surface of the bobbin 11. The space is in a vacuum state.

Heat shielding members 12 and 13 are attached to the gradient coil unit 2 so as to cover the whose inner and outer surfaces thereof, respectively. Additionally, the heat shielding members 12 and 13 are not necessary to cover the whole inner and outer surfaces of the gradient coil unit 2, but may be configured such that the surface of the end portion of the gradient coil unit 2 is not partly covered.

The heat shielding members 12 and 13 are formed of a material reflecting a far-infrared ray to shield the radiant heat of the gradient coil unit 2. Accordingly, as the heat shielding members 12 and 13, for example, metal materials may be used. At this time, it is desirable that the heat shielding members 12 and 13 are transparent with respect to a gradient magnetic field pulse so as not to flow an over current due to a pulse magnetic field which is generated by the gradient coil unit 2. In the case where the heat shielding members 12 and 13 are formed of metal materials, when the electric resistance value is sufficiently large, it is possible for the heat shielding members 12 and 13 to be transparent with respect to a frequency not more than that of the gradient magnetic field pulse. Specifically, the thickness of the heat shielding members 12 and 13 has to be not more than a skin depth corresponding to a maximum frequency of the gradient magnetic field pulse. In general, the frequency of the gradient magnetic field pulse is, for example, about 200 KHz at maximum, and the skin depth corresponding to the frequency is about 250 µm. Accordingly, a metal sheet of which the thickness is not more than 250 µm may be used as the heat shielding members 12 and 13. On the other hand, when the thickness of the heat shielding members 12 and 13 is not less than the skin depth corresponding to the magnetic resonance frequency, the heat shielding members 12 and 13 can be also used as a high-frequency shield (RE shield). For example, when a magnitude of the static magnetic field is 1.5 T, the magnetic resonance frequency is 64 MHz. In general, the skin depth corresponding to the magnetic resonance frequency is about 8 µm. Accordingly, in such a condition, when the metal sheet of which the thickness is not less than 8 µm is used, the heat shielding members 12 and 13 also function as the RF shield. However, although the thickness of the metal sheet functioning as the RF shield is the skin depth in theory, it is desirable that the thickness is three times the skin depth in order to actually realize the function of the RF shield. Accordingly, in such a condition, it is desirable that the metal sheet of which the thickness is not less than 24 µm is used. Further, when the thickness of the metal sheet is in the range of 30 to 50 µm or so to ensure a margin, the heat shielding members 12 and 13 can function as the RF shield in a secure manner.

In addition, the RF pulse to be shielded by the heat shielding members 12 and 13, for example, is generated from the body coil 6. For this reason, when the heat shielding member 12 functions as the RF shield in a secure manner, the heat shielding member 13 is not necessary to function as the RF shield. Thus, in the MRI apparatus 100, the thickness of the heat shielding member 12 is set to the thickness capable of securely functioning as the REF shield and the thickness of the heat shielding member 13 is set to be smaller than that of the heat shielding member 12.

Figure 4:
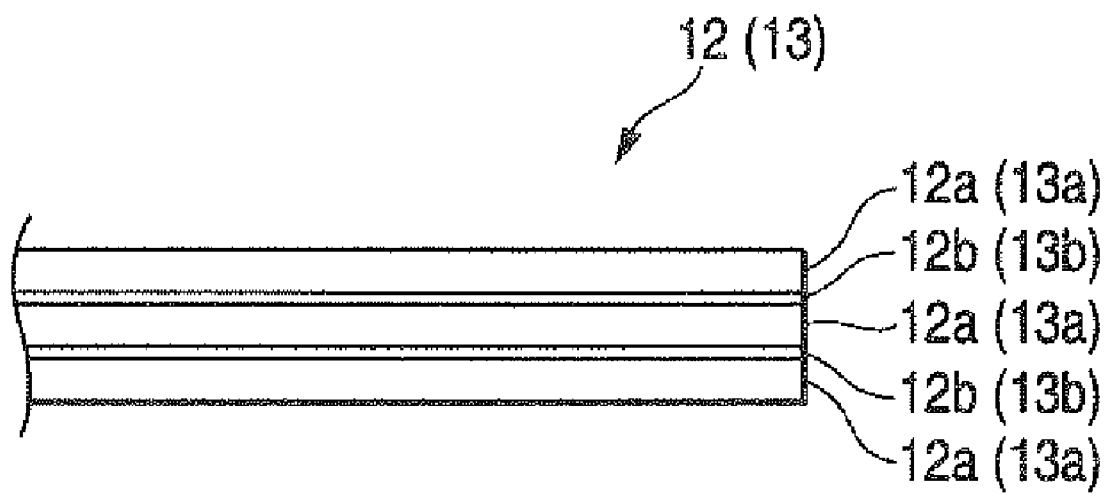
FIG. 4 is a view illustrating a configuration example of heat shielding members 12 and 13.

Moreover, there is a case where the radiant heat of the gradient coil unit 2 is not sufficiently shield just by using the metal sheet having the thickness that meets the above-described condition. In this case, as shown in FIG. 4, the heat shielding members 12 and 13 are formed such that a plurality of metal sheets 12a and 13a that meet the above-described condition are laminated with insulation layers 12b and 13b such as insulation films interposed therebetween. Accordingly, each of the plurality of metal sheets 12a and 13a can shield the radiant heat of the gradient coil unit 2, and thus the effect of heat shielding member is improved. However, each of the plurality of metal sheets 12a and 13a is electrically separated from each other, and thus the above-described characteristics are exhibited with respect to the gradient magnetic field pulse or the RF pulse.

According to the above-described embodiment, since the periphery of the gradient coil unit 2 is in a vacuum state, the main factor that induces a temperature rise of the bobbin 11 or the iron shim 14 by the heat of the gradient coil unit 2 is the radiant heat. However, the radiant heat of the gradient coil unit 2 is shielded by the heat shielding member 12, and the amount of the radiant heat to reach the bobbin 11 is reduced. As a result, it is possible to prevent the temperature rise of the bobbin 11 by the radiant heat of the gradient coil unit 2. Additionally, the radiant heat of the gradient coil unit 2 is shielded by the heat shielding member 13, and the amount of the radiant heat to reach the iron shim 14 is reduced. As a result, the temperature of the iron shim 14 is prevented from varying by the radiant heat of the gradient coil unit 2, and thus it is possible to prevent the variation in the static magnetic field in accordance with the temperature variation in the iron shim 14.

The radiant heat of the gradient coil unit 2 is kept inside area without being emitted to the outside of the gradient coil unit 2. However, the temperature rise of the gradient coil unit 2 is prevented by the cooling effect of the coolant flowing in the cooling pipes 22b and 24a that are disposed inside the gradient coil unit 2.

Since the thickness of the heat shielding members 12 and 13 is set to be transparent with respect to the gradient magnetic field pulse, any influence does not occur at the time the gradient magnetic field is formed. Additionally, since the thickness of the heat shielding member 12 is set to be opaque with respect to the RF pulse, it is possible to shield the RF pulse generated from the body coil 6 and the like. Accordingly, even when the RF shield is not provided additionally, it is possible to efficiently radiate the RE pulse to the subject 200.

This embodiment may be modified to various forms as described below.

One of the heat shielding members 12 and 13 may be provided.

As the shim unit, a configuration in which the shim coil generates a correction magnetic field may be used instead of the configuration in which the iron shim 14 is disposed. Alternatively, those configurations may be combined with each other.

The mechanism for cooling the gradient coil unit 2 may not be disposed in the gradient coil unit 2.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus comprising:
a static magnetic field magnet which generates a static magnetic field;
a gradient coil unit which generates a gradient magnetic field for overlapping with the static magnetic field;
a shim unit which is disposed between the static magnetic field magnet and the gradient coil unit to control the static magnetic field; and
a heat shielding member which is disposed between the gradient coil unit and the shim unit to shield a radiant heat of the gradient coil unit.

2. The magnetic resonance imaging apparatus according to claim 1, wherein the shim unit is formed so that at least one magnetic shim is disposed.

3. The magnetic resonance imaging apparatus according to claim 1, wherein the heat shielding member has a metal sheet of which a thickness is not more than a skin depth at a frequency of a gradient magnetic pulse which is supplied to the gradient coil unit.

4. The magnetic resonance imaging apparatus according to claim 3, wherein the heat shielding member is formed so that a plurality of the metal sheets are laminated with an insulation sheet interposed therebetween.

5. The magnetic resonance imaging apparatus according to claim 1, further comprising:
a cooling unit which cools the gradient coil unit.

6. The magnetic resonance imaging apparatus according to claim 5, wherein the gradient coil unit has the cooling unit disposed therein.

7. The magnetic resonance imaging apparatus according to claim 1, wherein the gradient coil unit is disposed in a vacuum state.

8. A magnetic resonance imaging apparatus comprising:
a static magnetic field magnet which generates a static magnetic field;
a gradient coil unit which generates a gradient magnetic field for overlapping with the static magnetic field;
a transmission coil which transmits a high-frequency pulse; and
a heat shielding member which is disposed between the gradient coil unit and the transmission coil to shield a radiant heat of the gradient coil unit and to shield the high-frequency pulse.

9. The magnetic resonance imaging apparatus according to claim 8, wherein the heat shielding member has a metal sheet of which a thickness is not more than a skin depth at a frequency of a gradient magnetic pulse which is supplied to the gradient coil unit and of which the thickness is not less than a skin depth at a frequency of the high-frequency pulse.

10. The magnetic resonance imaging apparatus according to claim 9, wherein the heat shielding member is formed so that a plurality of the metal sheets are laminated with an insulation sheet interposed therebetween.

11. The magnetic resonance imaging apparatus according to claim 8, further comprising:
a cooling unit which cools the gradient coil unit.

12. The magnetic resonance imaging apparatus according to claim 11, wherein the gradient coil unit has the cooling unit disposed therein.

13. The magnetic resonance imaging apparatus according to claim 8, wherein the gradient coil unit is disposed in a vacuum state.

* * * * *